US007149314B2

(12) United States Patent
Dahl et al.

(10) Patent No.: US 7,149,314 B2
(45) Date of Patent: Dec. 12, 2006

(54) REVERBERATION PROCESSOR BASED ON ABSORBENT ALL-PASS FILTERS

(75) Inventors: Luke Dahl, Santa Cruz, CA (US); Jean-Marc Jot, Aptos, CA (US)

(73) Assignee: Creative Technology Ltd, Singapore (SG)

( * ) Notice: Subject to any disclaimer, the term of this patent is extended or adjusted under 35 U.S.C. 154(b) by 1051 days.

(21) Appl. No.: 09/731,322

(22) Filed: Dec. 4, 2000

(65) Prior Publication Data

US 2002/0106090 A1 Aug. 8, 2002

(51) Int. Cl.
*H03G 3/00* (2006.01)
*G10H 1/02* (2006.01)

(52) U.S. Cl. ............................ 381/63; 381/61; 381/62; 84/630

(58) Field of Classification Search .................. 381/63, 381/61; 384/630
See application file for complete search history.

(56) References Cited

U.S. PATENT DOCUMENTS 4,731,848 A * 3/1988 Kendall et al. ............... 381/63
5,444,785 A * 8/1995 Izawa et al. .................. 381/63
5,491,754 A * 2/1996 Jot et al. ...................... 381/63
5,496,964 A * 3/1996 Suzuki ........................ 84/660
5,555,306 A * 9/1996 Gerzon ........................ 381/63
6,091,824 A * 7/2000 Lin et al. ...................... 381/63
6,721,426 B1 * 4/2004 Kurisu et al. ................ 381/63

OTHER PUBLICATIONS

Jot, "Efficient Models for Reverabtion and Distance Rendering in Computer Music and Virtual Audio Reality", ICMC, 1997, pp. 1-12.*
Stautner, "Designing Multi-Channel Reverberators", Computer Music Journal, vol. 6, No. 1, 1982.*
Datorro, Effect Design, Part II and II, Journal of Audio Engineering Society, vol. 45, No. 9, 1997, pp. 660-683 and pp. 764-788.*
Stautner, J., Puckette, M., "Designing Multi-Channel Reverberators," *Computer Music Journal*, vol. 6, No. 1; p. 52—62 (1982).
Dattoro, J., "Effect Design (Part 1: Reverberator and Other Filters; Part 2: Delay-Line Modulation and Chorus)," *Journal of the Audio Engineering Society*, vol. 45, No. 9-10; p. 660-788 (1997).
Jot, J.-M., "Efficient Models for Reverberation and Distance Rendering in Computer Music and Virtual Audio Reality," *International Computer Music Conference, Sep. 1997*(1997).

* cited by examiner

*Primary Examiner*—Vivian Chin
*Assistant Examiner*—Devona E. Faulk
(74) *Attorney, Agent, or Firm*—Schwegman, Lundberg, Woessner & Kluth, P.A.

(57) ABSTRACT

A reverberation processor includes a chain of absorbent all-pass filters and an absorbent delay line. The decay time can be precisely controlled by controlling the magnitude of the attenuation in the absorbent delay lines. Further, each absorbent delay line includes a low-pass filter for controlling the decay time at a particular high frequency.

22 Claims, 4 Drawing Sheets

REVERBERATION PROCESSOR BASED ON ABSORBENT ALL-PASS FILTERS

BACKGROUND OF THE INVENTION

Virtual auditory displays (including computer games, virtual reality systems or computer music workstations) create virtual worlds in which a virtual listener can hear sounds generated from sound sources within these worlds. In addition to reproducing sound as generated by the source, the computer also processes the source signal to simulate the effects of the virtual environment on the sound emitted by the source. In a first-person computer game, the player hears the sound that he/she would hear if he/she were located in the position of the virtual listener in the virtual world. One important environmental factor is reverberation, which refers to the reflections of the generated sound which bounce off objects in the environment. Reverberation can be characterized by measurable criteria, such as the reverberation time, which is a measure of the time it takes for the reflections to become imperceptible. Computer generated sounds without reverberation sound dead or dry. Additionally, reverberation is a very important effect utilized in music composition and rendering. Often a musical voice is recorded "dry" and then reverberation, or other effects, are added afterwards as post processing.

Artificial reverberation algorithms are well known in the art and are described e.g. in Stautner, J., and Puckette, M., "Designing Multi-Channel Reverberators," *Computer Music Journal*, Vol. 6, no. 1 (1982); Dattorro, J., "Effect Design (Part 1: Reverberator and Other Filters; Part 2: Delay-Line Modulation and Chorus)," *Journal of the Audio Engineering Society*, Vol. 45, no. 9–10 (1997); and Jot, J.-M., "Efficient Models for Reverberation and Distance Rendering in Computer Music and Virtual Audio Reality," *Proceedings of the* 1997 *International Computer Music Conference* (1997). The implementation of these algorithms on digital signal processors is based on a network of digital delay lines which are connected together and to the input and output points of the algorithm by feed-forward or feedback connections. Rooms of different sizes and acoustical properties can be simulated by modifying the topology of the network (the number of delay lines and the connections between them), by varying the duration of the delays, or by adjusting the amplification or attenuation coefficients of multipliers and filters inserted on the feed-forward or feedback connections.

As depicted in FIG. 1, a typical model of reverberation breaks the reverberation effects into discrete time segments. The first signal that reaches the listener is the direct-path signal, which undergoes no reflections. Subsequently, a series of discrete "early" reflections are received during an initial period of the reverberation response. Finally, after a critical time, the exponentially decaying "late" reverberation is modeled statistically because of the combination and overlapping of the various reflections. The magnitudes of Reflections_delay and Reverb_delay are typically dependent on the size of the room and on the position of the source and the listener in the room.

Accurate control of decay time has been demonstrated in a class of reverberator topologies, often referred to as "Feedback Delay Networks" (FDN), whose "lossless prototype" can be represented as a parallel bank of delay lines interconnected via a unitary (i.e. energy-preserving) feedback matrix. FDN Reverberators are disclosed in co-pending commonly assigned patent applications entitled ENVIRONMENTAL REVERBERATION PROCESSOR, filed Nov. 2, 1999 (Application Ser. No. 09/441,141) and REVERBERATION PROCESSOR FOR INTERACTIVE AUDIO APPLICATIONS, filed Apr. 11, 2000 (Application Ser. No. 09/547,365), which are hereby incorporated by reference for all purposes. Another popular class of reverberator topologies creates a late reverberation response by using arrangements of delays and all-pass filters inserted in a feedback loop. These topologies are popular due to the efficient generation of echoes and theoretically colorless frequency response of all-pass filters. However, these all-pass reverberators have lacked a mathematically accurate means of controlling decay time characteristics and output level and have had to rely instead on empirical or inaccurate methods.

SUMMARY OF THE INVENTION

According to one aspect of the invention, conventional all-pass filters used in a digital audio reverberation processor using cascaded all-pass filters and delays in a recursive feedback loop are replaced by modified all-pass filters, called absorbent all-pass filters, in which an absorbent filter is associated with each delay unit. Absorbent filters are designed to provide accurate, explicit control of reverberation decay time in multiple frequency bands.

According to another aspect of the invention, the output of the late reverberation module is normalized so that the reverberation intensity is independent of the reverberation decay time.

According to another aspect of the invention, reverberation modal density and echo density are also controlled independently from decay time and intensity. These criteria must be satisfied for a reverberator compliant with standard 3-D audio Application Programming Interfaces (APIs): EAX, 13DL2, OpenAL.

Other features and advantages of the invention will be apparent in view of the following detailed description and appended claims.

DESCRIPTION OF THE SPECIFIC EMBODIMENTS

The invention will now be described with reference to the preferred embodiments.

Figure 1:
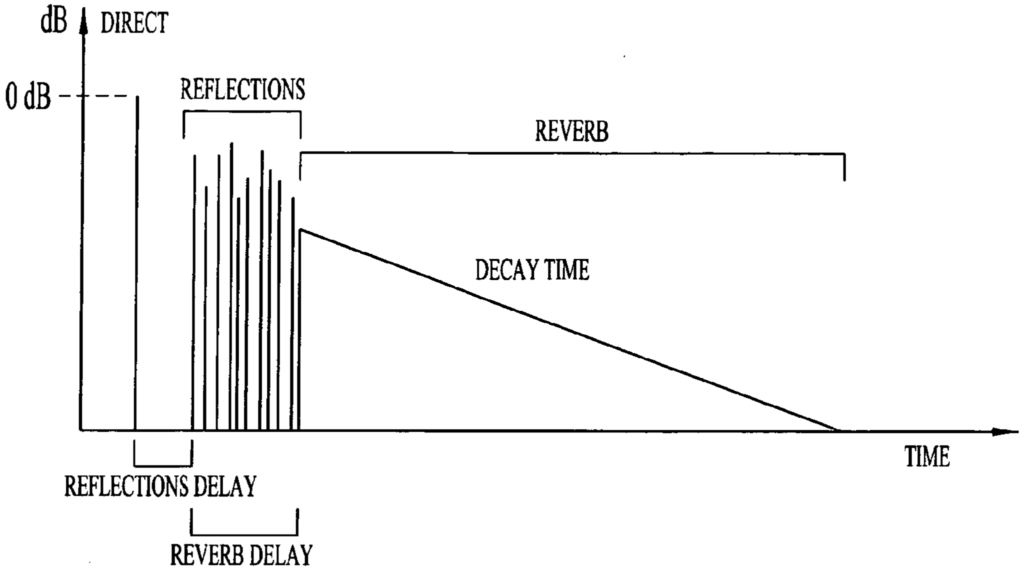
FIG. 1 (PRIOR ART)
FIG. 1 is a graph depicting the division of the reverberation response into early reflections and late reverberation.
Figure 2:
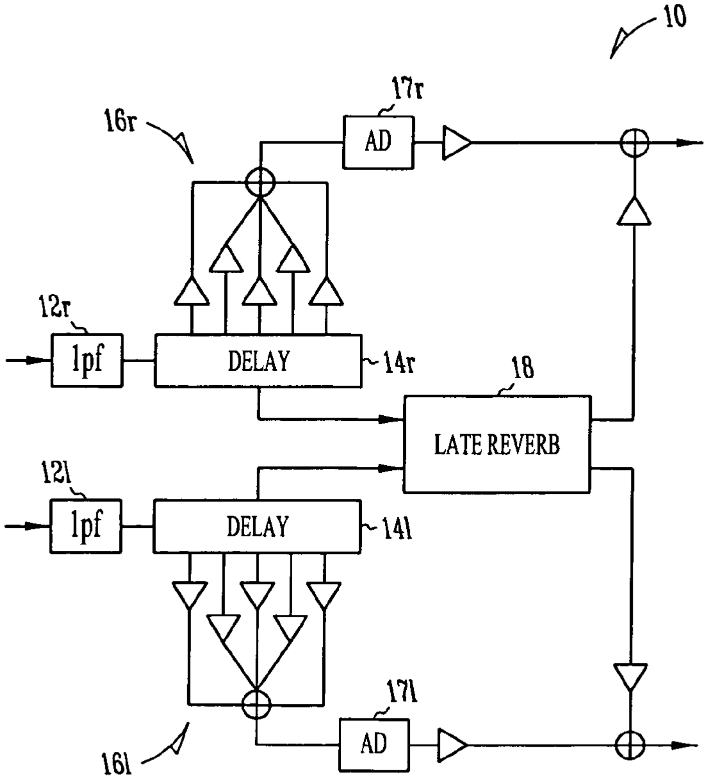
FIG. 2 is a block diagram of a complete reverberator.
Figure 3:
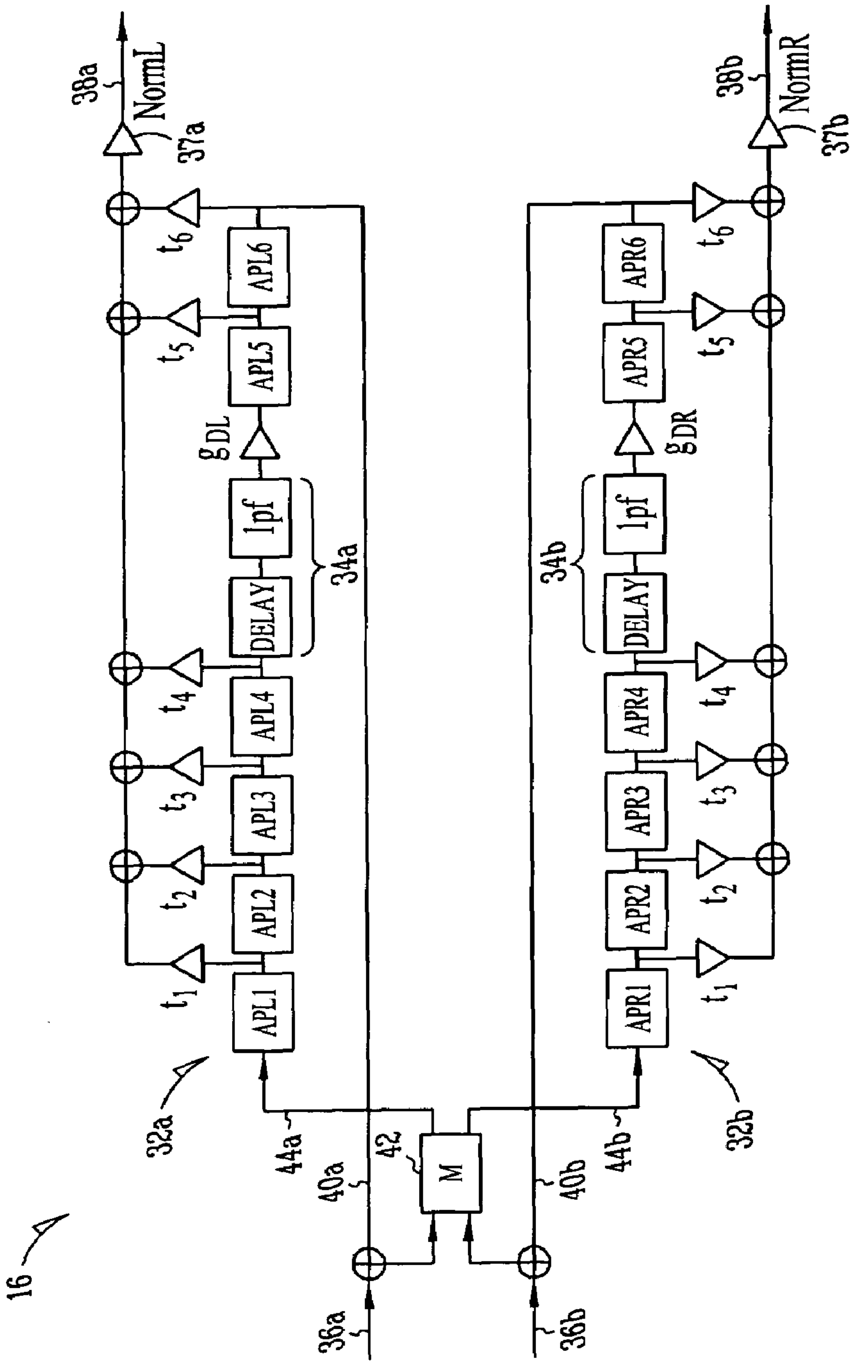
FIG. 3 is schematic diagram of a preferred embodiment of late reverberation processor.

The complete reverberator 10 is shown in FIG. 2. The inputs are passed through low-pass filters 12*r* and 121 before being sent through delay lines 14*r* and 141 and passed to the early reflection block 16 and late reverberation block 18. The early reflections are created by tapping the input delays and passing the summed signals through normal all-pass filters 17*r* and 171. The delay values of the early reflection taps and the late reverberation feeds are functions of the Reflections Delay and Reverb Delay parameters, as described below. FIG. 3 depicts an embodiment of the late reverberation block 18 which is made up of two chains 32*a* and 32*b* of absorbent all-pass filters AP R1–AP R6 and AP L1–AP L6 and absorbent delay lines 34*a* and 34*b*. Signals from the chains 32*a* and 32*b* are tapped, summed and passed through normalizing elements (described below) 37*a* and 37*b* to make the two late reverb outputs 38*a* and 38*b*. The inputs 36*a* and 36*b* to the late reverberation block 18 are added to the fed-back signals 40*a* and 40*b* from the ends of the all-pass/delay chains 32*a* and 32*b*, and these signals pass through a unitary mixing matrix 42 to feed the inputs 44*a* and 44*b* to both the all-pass/delay chains 32*a* and 32*b*.

Two independent output signals are obtained by tapping the chains after each absorbent all-pass filter. In the currently described embodiment, the absorbent all-pass delay lengths are chosen to be mutually prime, and are arranged in each chain in order of increasing length. The decay time is controlled by adjusting the attenuation and low-pass filter in each absorbent all-pass filter and after each delay line according to Equation (3) below. The modal density can be modified by scaling the amount of delay in the absorbent all-pass filters, and the echo density (or "diffusion") can be modified by changing the all-pass coefficient (g in FIG. 3) of the absorbent all-pass filters.

Figure 4:
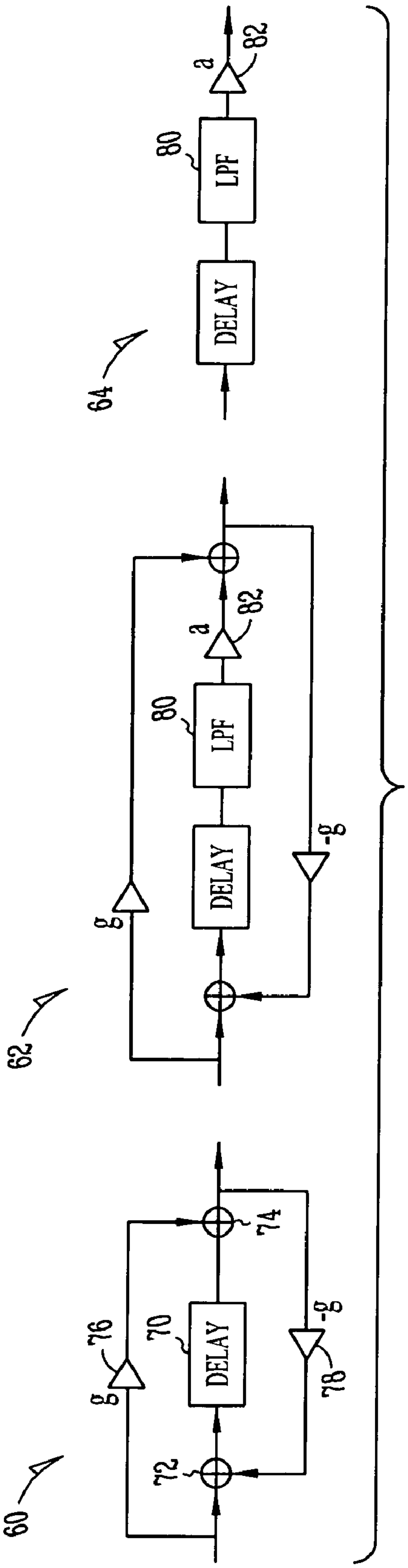
FIG. 4 is a schematic diagram of preferred embodiments of an all-pass filter, an absorbent all-pass filter, and an absorbent delay line.

FIG. 4 depicts an embodiment of a Normal All-Pass Filter 60, an embodiment of the Absorbent All-Pass Filter 62, and an embodiment of the Absorbent Delay Line 64. The Normal All-Pass Filter 60 includes a delay line 70, first and second mixers 72 and 74, and feed-forward and feedback gain control elements 76 and 78 which amplify a signal by the all-pass coefficient "g". Details on delay line length and the magnitude of "g" are described below.

An all-pass filter is any filter whose magnitude response is equal to 1 for all frequencies. All-pass filters have a transfer function H(z) that can be represented as a ratio of two polynomials in the complex variable z, $$H(z) = \frac{B(z)}{A(z)}$$

where the coefficients of B are the coefficients of A in reverse order. For example:

$$H(z) = \frac{1 + 0.5z^{-1} + 0.25z^{-2} + 0.12z^{-3}}{0.12 + 0.25z^{-1} + 0.5z^{-2} + z^{-3}}$$

There are a number of topologies which can implement transfer functions of this form, and all of them are all-pass.

Any all-pass filter can be made into an absorbent all-pass filter by associating in series with each delay line in the filter an attenuation which may vary with frequency. When an absorbent all-pass filter is used in a late reverberation block these attenuations are used to control the decay time of the late reverberation according to Equations (3) or (4) below. If the attenuations vary with frequency then the decay time can be controlled at multiple frequencies. One method of creating a frequency dependent attenuation is to use both a low-pass filter 80 and an attenuation gain element 82 associated in series with each delay line.

The attenuation gain 82 precisely controls the decay time at low and mid frequencies, and the low-pass filter 80, having a gain at a specified high frequency dependent on the delay length, controls the decay time at the specified high frequency.

The following list of control parameters (compliant with the Level 2.0 Interactive 3D Audio Rendering Guideline (13DL2) of the 3D Working group of the Interactive Audio Special Interest Group) describes briefly what aspects of the reverb algorithm are affected by each reverberation control parameter.

Room:

Room affects the gain of the reverb output (both early reflections and late reverberation.)

Room HF:

RoomHF controls the high frequency attenuation of the low-pass filters at the inputs to the reverberator.

Decay Time:

The decay time of the late reverberation at low frequencies is controlled by adjusting the absorbent attenuations in the absorbent all-pass filters and absorbent delay lines (denoted 'a' in the diagrams.)

Decay HF Ratio:

The ratio of high frequency decay time to low frequency decay time in the late reverberation is controlled by adjusting the high-frequency attenuation of the low-pass filters in the absorbent delays and absorbent all-pass filters.

Reflections:

Reflections controls the output gain/attenuation of the early reflections.

Reflections Delay:

Reflections Delay controls the delay time between the input to the reverberator and the first tap of the early reflections.

Reverb:

Reverb controls the output gain/attenuation of the late reverberation.

Reverb Delay:

Reverb Delay controls the delay between the first tap of the early reflections and the input to the late reverberation processor. It also controls the spread of the early reflection taps.

Diffusion:

Diffusion controls the all-pass coefficient (denoted 'g' in the diagrams) of the absorbent all-pass filters in the late reverberation processor, thus affecting the echo density.

Density:

Density scales the delay lengths in the late reverb, specifically the delays in the absorbent all-pass filters and absorbent delays, thus affecting the modal density.

HF Reference:

HF Reference sets the frequency at which the input low-pass filters and the low-pass filters in the absorbent delays and absorbent all-pass filters are controlled. In other words Room HF and Decay HF Ratio control the attenuation at HF Reference of these low-pass filters.

The elements in the currently described embodiment of the late reverberation processor 16 of FIG. 3 will now be described in greater detail.

In the currently described embodiment, the delay lengths of the absorbent all-pass filters are chosen to be mutually prime, and are arranged in each chain in order of increasing length. The decay time is controlled by adjusting the attenuation and low-pass filter in each absorbent all-pass and after each delay line according to Equation (3) below. The modal density can be modified by scaling the amount of delay in the absorbent all-pass filters, and the echo density (or "diffusion") can be modified by changing the all-pass coefficient (g in FIG. 4) of the absorbent all-pass filters.

Mixing Matrix:

The mixing matrix 42 mixes the two inputs 36*a* and 36*b* to the late reverberation block 16 along with the two feedback signals 40*a* and 40*b* into two signals 44*a* and 44*b* which feed the late reverb all-pass/delay chains 32*a* and 32*b*. The matrix is designed to have a unitary energy gain. The matrix outputs are calculated from the matrix inputs according to the following formulas:

$$LeftOut = -\frac{1}{\sqrt{2}}LeftIn + \frac{1}{\sqrt{2}}RightIn \tag{1}$$

$$RightOut = -\frac{1}{\sqrt{2}}LeftIn - \frac{1}{\sqrt{2}}RightIn$$

Delay Lengths:

The delay lengths of the absorbent all-pass filters in the late reverberation processor are functions of the Density parameter. Each absorbent all-pass filter has a different delay length with each absorbent all-pass filter in the chain having a longer delay than the previous. These lengths are calculated so that none of the delay lengths are integer multiples of any of the other lengths, and so that the lengths decrease as Density decreases.

All-Pass Coefficient and Diffusion:

The all-pass coefficient of the absorbent all-pass filters (denoted 'g' in FIG. 4) is set as a function of the Diffusion property. All the filters in the late reverberation processor have the same all-pass coefficient, and it is calculated from the following equation:

$$g=MAXALLPASS*(\text{Diffusion}/100) \tag{2}$$

where MAXALLPASS is defined as 0.61803 (which is the solution to 1−x^2=x.)

Absorbent Gains and Filters:

The absorbent gain in the absorbent all-pass filters and delays (denoted 'a' in the diagrams) is a function of the Decay Time property and the length of each particular delay. The absorbent gain can be calculated using the following formulas:

$$\text{length} = \text{Delay\_Length\_in\_milliseconds} \tag{3}$$

$$Tr = \text{Decay\_Time\_in\_milliseconds}$$

$$adB = -60 * \text{length}/Tr$$

$$a = 10^{\frac{adB}{20}}$$

In general, the absorbent gain is implemented by applying to each delay line an attenuation whose logarithm is proportional to the delay length, which has the effect of multiplying the system's impulse response by an exponentially decaying envelope.

Low-Pass Filter:

In general, the decay time can be made frequency-dependent by making each attenuation into a filter $G_i(z)$ whose gain at any frequency $\omega$ is dependent on the delay length $\tau_i$ and the desired decay time $Tr(\omega)$) at that frequency:

$$20\log_{10}|G_i(e^{i\omega})|=-60\tau_i/Tr(\omega) \tag{4}$$

In the present embodiment the decay time is controlled at two frequencies by associating a Low Pass Filter (LPF) in series with each absorbent gain.

Figure 5:
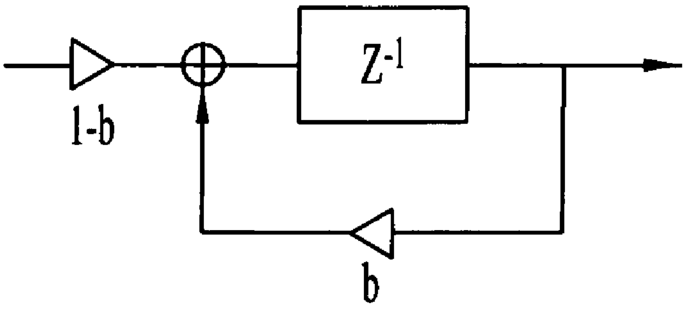
FIG. 5 is a schematic diagram of a low-pass filter.

FIG. 5 is a schematic diagram of the low-pass filter 80 in each of the absorbent delays 64 and absorbent all-pass filters 62, designated LPFs in FIG. 4. Each LPF is a DC-normalized, one-pole filter, and is described below. The filter coefficient, "b", for each absorbent all-pass filter or delay is a function of the delay length for that particular absorbent all-pass filter or delay, the value of the Decay Time property, the value of the Decay HF Ratio property, and the value of the HF Reference property.

Both inputs are filtered by a DC-normalized, one-pole low-pass filter, which has the transfer function $$H(z) = \frac{1-b}{1-bz^{-1}} \tag{5}$$

The filter coefficient 'b' is calculated from the values of RoomHF and HF Reference according to the following pseudo-code:

```
FS = Sampling Rate in samples per second;
Fc = HF Reference Value, in Hz;
DbGainAtFC = −60*length/(HFRatio*Tr);
G = pow(10.0, DbGainAtFc / 20.0);
if(G==1.0){
        b = 0.0;
    }
    else{
        omega = cos(2*PI*Fc/FS);
        A = 8.0*G − 4.0*G*G − 8.0*G*omega +
4.0*G*G*omega*omega;
        b = (2*G*omega − 2.0 + sqrt(A)) / (2.0*G − 2.0);
        b = (b>1.0)?1.0:b;
        b = (b<0.0)?0.0:b;
}
```

where length and Tr are the same as those in the above gain calculation (eq. 3).

Taps:

In the late reverb the signal after each absorbent all-pass in a chain is tapped and summed into the output for that side.

Output Level and Normalization:

The summation of the late reverb taps for each side is multiplied by one final value before being sent to the output. This last multiply is used for three purposes: 1) Adjust the output level for the Room property; 2) Adjust the output level of the late reverberation prosessor for the Reverb property; and 3) normalize the energy output of the late reverberation.

Figure 6:
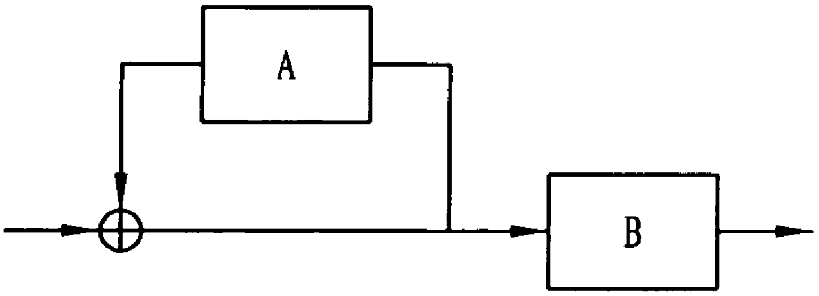
FIG. 6 is a block diagram of a feedback loop.

The intensity level of the late reverberation response can be controlled independently of the other parameter settings by normalizing the energy gain of the late reverberation network, and adjusting the level of the normalized output. To determine the energy gain of the late reverberation network it is useful to describe the network as a feedback loop with loop energy gain A, and output energy gain B, as in FIG. 6.

The energy gain is then the product of the output gain B and a geometric series of A:

$$\text{EnergyGain}=B(1+A+A^2+A^3+) \tag{6}$$

The system impulse response is the sum of a series of elementary impulse responses (corresponding to a different numbers of trips through the feedback loop). Equation (6) assumes that these elementary impulse responses are mutually uncorrelated signals, so that the total energy is the sum of their individual energies. This assumption is made because the impulse response of each pass through the two chains of cascaded absorbent all-pass filters has few large interfering terms in the successive impulse response due to the mixing matrix and the use of large mutually prime delay lengths. Since, for finite decay times, the loop energy gain A is less than one, the geometric series can be simplified to 1/(1-A) and the amount of normalization required is:

$$Norm = \sqrt{\frac{1}{EnergyGain}} = \sqrt{\frac{1-A}{B}} \tag{7}$$

To calculate the loop energy gain A of the late reverberation processor described in FIG. 3, the energy gain for each of the two chains of filters is first calculated. The energy gain of each chain can be approximated as the product of the energy gains of each filter and attenuation in the chain, where energy gain of a filter is defined as the sum of its squared impulse response. This assumption is made because the use of mutually prime delay lengths ensures that the cross terms between convolved absorbent all-pass filter impulse responses will occur seldom and only late in the response where the terms are small.

The loop energy gain A for the entire reverberation loop is then the sum of the energy gains of the two branches:

$$A = g_{DL}^2 \cdot \prod_i c_{Li} + g_{RL}^2 \cdot \prod_i c_{Ri} \tag{8}$$

where $C_{Li}$ is the energy gain for the with absorbent all-pass filter in the left chain, and $g_{DL}$ is the attenuation associated with the delay line in the left chain. Similarly, $c_{Ri}$, and $g_{DR}$ are the energy gains for the right absorbent all-passes and attenuation.

The left and right output gains BL and BR are calculated by assuming that the total energy gain at the output is the sum of the energy gains after each tap (see FIG. 3). The energy gain after each tap is the product of the energy gain in the chain up to that tap, which is calculated as the product of filter gains, as in Equation (8), and the energy gain of the tap. For example, the output gain of the left output is:

$$B_L = t_1^2 c_{LI} + t_2^2 \cdot \prod_{i=1}^{2} c_{Li} + \ldots + t_6^2 g_{DL}^2 \cdot \prod_{i=1}^{6} c_{Li} \tag{9}$$

The left and right outputs are normalized by multiplying by NormL and NormR where:

$$NormL = \sqrt{\frac{1-A}{B_L}}, \tag{10}$$

$$NormR = \sqrt{\frac{1-A}{B_R}}$$

The last remaining step is to calculate the energy gain for each absorbent all-pass filter, which we defined as the sum of the squared impulse response samples. We calculate the energy gain at low frequencies by ignoring the effect of the low-pass filter in the absorbent all-pass filter.

By examining the impulse response of an absorbent all-pass filter (with low-pass filtering disabled) it can be easily shown that the energy gain is a function of the all-pass coefficient g and the absorbent gain a (shown in FIG. 4):

$$c_{Li} = g^2 + (1-g^2)\frac{a_{Li}^2}{1-a_{Li}^2 g^2} \tag{11}$$

It is possible to calculate the energy normalization values in the same routine in which the absorbent gains and filter coefficients are calculated.

Once the normalization values are calculated, the output gain for the left and right branches of the late reverberation processor can be calculated. The output gain takes into account the Room and Reverb levels as well as the energy normalization. There is an additional correction that takes place when the two reverb outputs will be added together to make a mono signal. This additional correction depends on the value of the Diffusion property. The following pseudo code shows how the late reverb output levels of the late reverberation block are calculated in the currently described embodiment:

```
    val = (Room Value + Reverb Value) / (100.0);      // /100 to go from mB to dB.
    val = pow(10,val/20.0);                           // convert to amplitude
    if(val > 1.0)
        val = 1.0;
    if(stereo outputs will be summed to mono)
{
diff_adj = pow(10, 3.5*Diffusion Value/ (100*20); // adjust normalization by +3.5dB
// for max diffusion. scale linearly
// in dB.
    }
    else
        diff_adj = 1.0;
    Left Reverb Output Level = val * NormL * diff_adj;
    Right Reverb Output Level = val * NormR * diff_adj;
```

Note from eq. (10) above that the value of the parameter Norm is equal to the square root of the reciprocal of the energy gain of the late reverberation network. Thus, by amplifying the output signal by Norm the gain of the late reverberation loop is canceled and the output level of the reverberation block is independent of the parameter settings.

For example, as demonstrated in eqs. (10) and (11), in the currently described embodiment the gain of the late reverberation loop is dependent on the value of the Diffusion parameter. The normalization described above cancels the effect of the Diffusion parameter on the loop gain so that echo density can be varied without changing the output level. It then possible to adjust the output level based solely on the values of the Room and Reverb parameters.

As is well known in the art, the block diagrams depicted in FIGS. 2 and 3 can be implemented entirely in hardware, software, or a combination thereof. For example, in a hardware embodiment the normalization would be implemented by an amplifier having a gain set to attenuate the loop output signal by Norm. In a software embodiment the value of the output signal would be multiplied by Norm. In a currently preferred embodiments the input signals are digital audio signals, the filters and gain elements are implemented in software, stored in a computer readable medium which may include digital data encoded in electromagnetic signals or stored in magnetic or optical media, executed on a processor.

The invention has now been described with reference to the preferred embodiments. Alternatives and substitutions will now be apparent to persons of skill in the art. In particular, the detailed structure of the late reverb described is not necessary to practice the invention. Other topologies for implementing a late reverberation block are well known in the art. Additionally, there are a number of topologies which can implement all-pass filters, and all of them can be made into absorbent all-pass filters by having attenuations associated in series with their delay lines. Accordingly, these different topologies may be utilized in implementations of the invention. Also, for different implementations the calculation of Norm would be varied to take into account different elements. Accordingly, it is not intended to limit the invention except as provided by the appended claims.

What is claimed is:

1. A reverberation processor comprising:

a network including a plurality of absorbent all-pass filters in a reverberation feedback loop;

with each absorbent all-pass filter comprising:

at least one delay element for introducing a delay length into an input signal received by the delay element;

an attenuator, associated in series with the delay element, for attenuating by an attenuation factor whose logarithm is proportional to the delay length; and a filter feedback loop including the at least one delay element and the attenuator, such that, when each attenuation factor is 1, the absorbent all-pass filter is a normal all-pass filter.

2. The reverberation processor of claim 1 where said absorbent all-pass filter comprises:

a low-pass filter associated in series with said delay element and said attenuator, for making said attenuation factor frequency dependent.

3. The reverberation processor of claim 1 further comprising:

a normalizer, coupled to an input or an output of said network for amplifying an output signal of said network by a gain equal to the reciprocal of the gain of the network so that the power of the output signal is independent of values of control parameters affecting the gain of the network.

4. A method for adding reverberation to an audio signal comprising:

applying a series of absorbent all-pass filters in a reverberation feedback loop to an input signal to form a delayed feedback signal and to form a plurality of intermediate signals resulting from each absorbent all-pass filter;

adding the delayed feedback signal to the input signal to form a present input signal;

tapping and summing the plurality of intermediate signals to form a reverberation output signal; and with each absorbent all-pass filter performing:

delaying and attenuating a filtered signal in a filter feedback loop with an attenuation factor whose logarithm is proportional to the delay length, such that, when the attenuation factor is 1, the absorbent all-pass filter is a normal all-pass filter.

5. The method of claim 4 where said act of attenuating further comprises:

low-pass filtering the input signal to add attenuation at a specified high frequency.

6. A method for normalizing the output signal power of a reverberation processor having a feedback loop comprising at least one absorbent all-pass filter, with each absorbent all-pass filter comprising:

at least one delay element for introducing a delay length into an input signal received by the delay element; and an attenuator, associated in series with the delay element, for attenuating by an attenuation factor whose logarithm is proportional to the delay length;

such that, when the attenuation factor is 1, the absorbent all-pass filter is a normal all-pass filter;

said method comprising the acts of:

determining the loop energy gain A of the feedback loop; and scaling the output signal by the square root of(1-A) to form a normalized output signal so that the power of the normalized output signal is not affected by the gain of the feedback loop.

7. The method of claim 6 further comprising:

setting an attenuation factor in at least one absorbent all-pass filter according to the value of a decay time parameter provided to the reverberation processor.

8. The method of claim 6 further comprising:

setting a all-pass coefficient gain parameter on the feed forward and feedback paths of at least one absorbent all-pass filter according to the value of a diffusion parameter provided to the reverberation processor.

9. The method of claim 6 further comprising:

applying a scaling factor to the normalized output signal in response to parameters controlling the reverberation level.

10. A reverberation processor comprising:

a delay line;

a late reverb tap out of the delay line;

a late reverb chain of tapped absorbent all-pass filters and at least one absorbent delay line, with the chain having an input coupled to the late reverb tap, and with each absorbent all-pass filter comprising:

a delay line having a delay line input and a delay line output, a low-pass filter coupled to receive the delay line output, an attenuator coupled to receive the low-pass filter output signal and having an attenuation output, feed-forward and feedback gain control elements each having an input and an output, and first and second mixers, with the first mixer having a first input coupled to receive the input signal, a second input coupled the output of the feedback gain control element, and an output coupled to the input of the delay line and the second mixer having a first input coupled to the attenuation element, a second input coupled to receive the input signal, and an output coupled to the input of the feedback gain control element;

and with each absorbent delay line comprising:

a delay line having a delay line input and a delay line output, a low-pass filter coupled the delay line output, and an attenuator coupled to receive the low-pass filter output signal and having an attenuation output;

a summing element coupled to taps of the late reverb chain to form a late reverb tapped output signal;

a feedback summing element coupled to an output of the late reverb chain and an input of the late reverb chain; and a normalizing element, coupled to receive the late reverb tapped output signal, to scale the output signal by the square root of (1-A), where A is the loop energy gain of the late reverb chain, to form a normalized late reverb output signal.

11. The reverberation processor of claim 10 further comprising:

an amplification element for amplifying the normalized late reverb output signal according to level control parameters provided to the reverberation processor.

12. A method for normalizing the output signal power of a reverberation processor having a reverberation feedback loop comprising a plurality of absorbent all-pass filters, with each absorbent all-pass filter comprising:

at least one delay element for introducing a delay length into an input signal received by the delay element;

an attenuator, associated in series with the delay element, for attenuating by an attenuation factor whose logarithm is proportional to the delay length; and a filter feedback loop including the at least one delay element and the attenuator, such that, when the attenuation factor is 1, the absorbent all-pass filter is a normal all-pass filter;

said method comprising:

scaling the output signal to form a normalized output signal so that the power of the normalized output signal is not affected by the gain of the feedback loop.

13. A reverberation processor comprising:

a delay line;

a late reverb tap out of the delay line;

a late reverb chain of tapped absorbent all-pass filters and at least one absorbent delay line, with the chain having an input coupled to the late reverb tap, and with each absorbent all-pass filter comprising:

a delay line having a delay line input and a delay line output, a low-pass filter coupled to receive the delay line output, an attenuator coupled to receive the low-pass filter output signal and having an attenuation output, feed-forward and feedback gain control elements each having an input and an output, and first and second mixers, with the first mixer having a first input coupled to receive the input signal, a second input coupled the output of the feedback gain control element, and an output coupled to the input of the delay line and the second mixer having a first input coupled to the attenuation element, a second input coupled to receive the input signal, and an output coupled to the input of the feedback gain control element;

and with each absorbent delay line comprising:

a delay line having a delay line input and a delay line output, a low-pass filter coupled the delay line output, and an attenuator coupled to receive the low-pass filter output signal and having an attenuation output;

a summing element coupled to taps of the late reverb chain to form a late reverb tapped output signal;

a feedback summing element coupled to an output of the late reverb chain and an input of the late reverb chain; and a normalizing element, coupled to receive the late reverb tapped output signal, to scale the output signal to form a normalized late reverb output signal.

14. A reverberation processor comprising:

a network including a plurality of absorbent all-pass filters in a reverberation feedback loop;

with each absorbent all-pass filter comprising:

at least one absorbent delay element for introducing a delay length and an attenuation into an input signal received by the absorbent delay element; and a filter feedback loop including the at least one absorbent delay element, with each absorbent delay element comprising:

a delay element to introduce a delay length into an input signal received by the delay element; and an attenuator, associated in series with the delay element, for attenuating by an attenuation factor whose logarithm is proportional to the delay length;

such that, when said each absorbent delay element has an attenuation factor of 1, the absorbent all-pass filter is a normal all-pass filter.

15. The reverberation processor of claim 14, where said absorbent delay element comprises:

a low-pass filter associated in series with said delay element and said attenuator, for making said attenuation factor frequency dependent.

16. The reverberation processor of claim 14, where each absorbent all-pass filter comprises:

a low-pass filter associated in series with said delay element and said attenuator, for making said attenuation factor frequency dependent; and an absorbent all-pass filter feed-forward gain control element.

17. A reverberation processor comprising:

a first reverberation feedback loop including a plurality of absorbent all-pass filters;

a second reverberation feedback loop including a plurality of absorbent all-pass filters; and a mixing matrix to feed at least two input signals into both the first and the second feedback loops;

with each absorbent all-pass filter comprising:

at least one delay element for introducing a delay length into an input signal received by the delay element;

an attenuator, associated in series with the delay element, for attenuating by an attenuation factor whose logarithm is proportional to the delay length; and a filter feedback loop including the at least one delay element and the attenuator.

18. The reverberation processor of claim 17, wherein when attenuation factors of all the delay elements are 1, the at least one absorbent all-pass filter of the first and the second feedback loops are normal all-pass filters.

19. The reverberation processor of claim 17, wherein the mixing matrix is a unitary mixing matrix.

20. A method for adding reverberation to an audio signal comprising:

feeding a first input signal into a first reverberation feedback loop including a plurality of absorbent all-pass filters;

feeding a second input signal into a second reverberation feedback loop including a plurality of absorbent all-pass filters; and mixing the first and the second input signals into both the first and the second feedback loops, with each absorbent all-pass filter delaying and attenuating a filtered signal in a filter feedback loop with an attenuation factor whose logarithm is proportional to a delay length.

21. The method claim 20, which includes configuring the absorbent all-pass filters as normal all-pass filters when attenuation factors of all the delay elements are 1.

22. A reverberation processor comprising:

a network including a plurality of absorbent all-pass filters in a reverberation feedback loop;

with each absorbent all-pass filter comprising:

at least one absorbent delay element for introducing a delay length and an attenuation into an input signal received by the absorbent delay element; and a filter feedback loop including the at least one absorbent delay element, with each absorbent delay element comprising:

a delay element to introduce a delay length into an input signal received by the delay element;

an attenuator, associated in series with the delay element, for attenuating by an attenuation factor whose logarithm is proportional to the delay length;

a low-pass filter associated in series with said delay element and said attenuator, for making said attenuation factor frequency dependent; and an absorbent all-pass filter feed-forward gain control element;

such that, when said each absorbent delay element has an attenuation factor of 1, the absorbent all-pass filter is a normal all-pass filter.

* * * * *